(12) United States Patent
Shih et al.

(10) Patent No.: US 8,765,330 B2
(45) Date of Patent: Jul. 1, 2014

(54) PHASE SHIFT MASK FOR EXTREME ULTRAVIOLET LITHOGRAPHY AND METHOD OF FABRICATING SAME

(75) Inventors: Chia-Tsung Shih, Hsinchu (TW); Pei-Chung Hsu, Taipei (TW); Shinn-Sheng Yu, Hsinchu (TW); Tsiao-Chen Wu, Jhudong Township, Hsinchu County (TW); Yen-Cheng Lu, New Taipei (TW); Shu-Hao Chang, Taipeit (TW); Chia-Jen Chen, Jhudong Township, Hsinchu County (TW); Hsin-Chang Lee, Hsin-Chu Xian (TW); Anthony Yen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 23 days.

(21) Appl. No.: 13/564,198

(22) Filed: Aug. 1, 2012

(65) Prior Publication Data

US 2014/0038086 A1 Feb. 6, 2014

(51) Int. Cl.
*G03F 1/24* (2012.01)
*G03F 1/54* (2012.01)

(52) U.S. Cl.
USPC ............................................................. 430/5

(58) Field of Classification Search
USPC ........................................ 430/5, 319; 378/35
See application file for complete search history.

(56) References Cited

U.S. PATENT DOCUMENTS

| | | | |
|---|---|---|---|
| 5,783,337 A | 7/1998 | Tzu et al. | |
| 2008/0248409 A1* | 10/2008 | Ishibashi et al. | 430/5 |
| 2008/0254376 A1 | 10/2008 | Lin et al. | |
| 2011/0059391 A1 | 3/2011 | Shoki | |
| 2011/0104595 A1 | 5/2011 | Hayashi et al. | |

OTHER PUBLICATIONS

Shinn-Sheng Yu et al., "On the Extensibility of Extreme-UV Lithography," Proc. Of SPIE Digital Library, vol. 7969 79693, pp. A1-A11.
Takashi Kamo et al., "Light-Shield Border Impact on the Printability of Extreme-Ultraviolet Mask," Journal of Micro/Nanolithography, MEMS and MOEMS 10(2), 023001 (Apr.-Jun. 2011), 10 pages.

\* cited by examiner

*Primary Examiner* — Stephen Rosasco
(74) *Attorney, Agent, or Firm* — Haynes and Boone, LLP

(57) ABSTRACT

A mask and method of fabricating same are disclosed. In an example, a mask includes a substrate, a reflective multilayer coating disposed over the substrate, an $Ag_2O$ absorber layer disposed over the reflective multilayer coating, and a tantalum-containing absorber layer disposed over the $Ag_2O$ absorber layer. The tantalum-containing absorber layer is disposed over the $Ag_2O$ absorber layer outside a mask image region of the mask, such that the mask image region of the mask is free of the tantalum-containing absorber layer. In an example, the tantalum-containing absorber layer is disposed over the $Ag_2O$ absorber layer adjacent to the mask image region.

20 Claims, 10 Drawing Sheets

PHASE SHIFT MASK FOR EXTREME ULTRAVIOLET LITHOGRAPHY AND METHOD OF FABRICATING SAME

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, higher resolution lithography processes, such as extreme ultraviolet (EUV) lithography processes, are implemented to meet size constraints approaching critical dimension tolerances of 32 nm technology nodes and below. EUV lithography uses a reflective mask (also referred to as a reticle) to transfer a pattern of a layer of an integrated circuit device to a wafer. An exemplary reflective mask is a phase shift mask, which typically includes a patterned absorber layer disposed on a reflective multilayer coating (multi-layered mirror stack), where the patterned absorber layer defines the pattern of the layer of the integrated circuit device in a mask image region of the phase shift mask. Conventional EUV lithography tools undesirably project EUV radiation onto a portion of the phase shift mask outside the mask image region of the phase shift mask, resulting in undesired exposure or overexposure of portions of the exposed wafer. Such undesired exposure (or overexposure) leads to reduced aerial image contrast in the patterns printed on the exposed wafer. Accordingly, although existing EUV masks and methods of manufacturing EUV masks have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
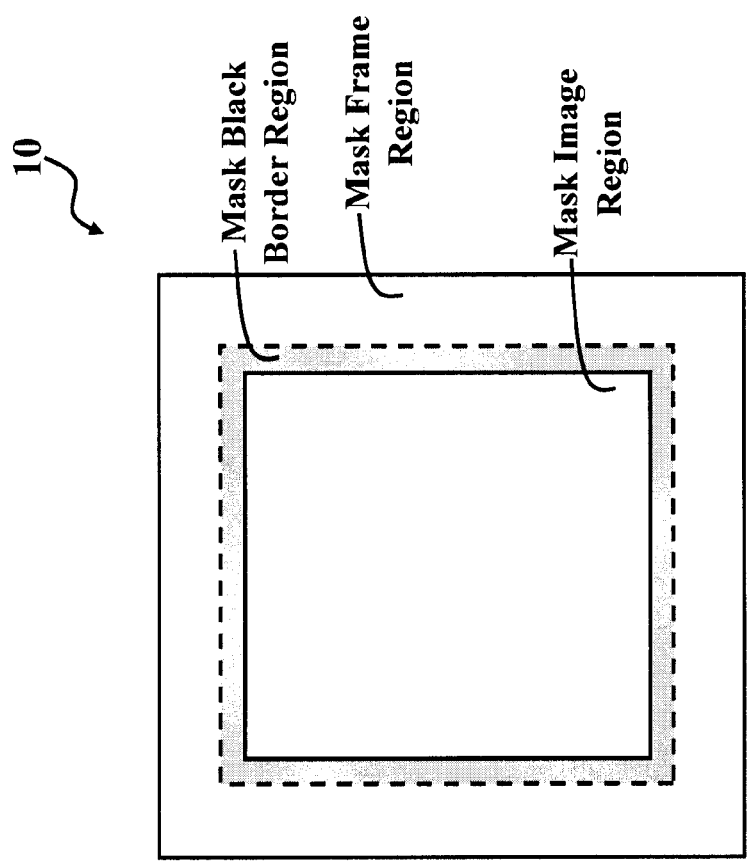
FIG. 1A is a top schematic view of a mask, in portion or entirety, according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
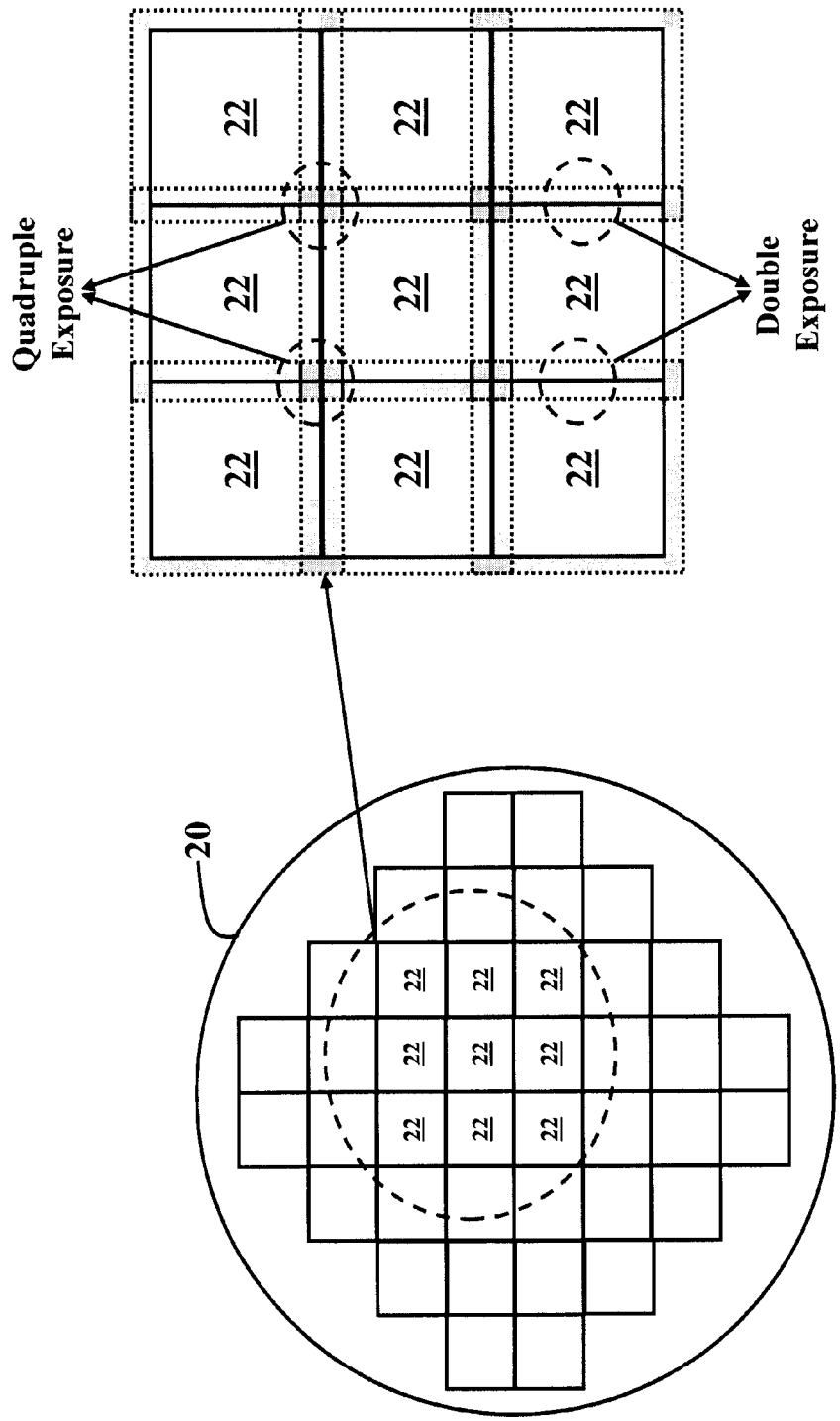
FIG. 1B is a top schematic view of a wafer that is exposed using the mask of FIG. 1A according to various aspects of the present disclosure.

FIG. 1A is a top schematic view of a mask 10, in portion or entirety, according to various aspects of the present disclosure, and FIG. 1B is a top schematic view of a wafer 20, in portion or entirety, that is exposed using the mask 10 of FIG. 1A according to various aspects of the present disclosure. FIGS. 1A and 1B will be discussed concurrently, and FIGS. 1A and 1B have been simplified for the sake of clarity to better understand the inventive concepts of the present disclosure.

The mask 10 is a reflective mask. In the depicted embodiment, the mask 10 is a phase shift mask, such as an attenuated phase shift mask (AttPSM). Alternatively, the phase shift mask is an alternating phase shift mask (AltPSM). The mask 10 includes a mask image region and a mask frame region. The mask image region is an area of the mask 10 that includes a pattern (or design) of a layer of an integrated circuit device. The mask frame region is an area of the mask 10 that does not include the pattern of the layer of the integrated circuit device. The mask frame region may include alignment marks (also referred to as fiducial marks). The mask frame region borders the mask image region and, in the present example, the mask frame region surrounds the mask image region, defining the mask image region of the mask 100.

The mask 10 is used to transfer the pattern of the mask image region to a wafer, such as the wafer 20. In the present example, where the mask 10 is a phase shift mask, the mask 10 includes absorptive regions, which absorb light incident thereon, and reflective regions, which reflect light incident thereon. The absorptive regions can be configured to reflect light incident thereon with a phase different than light reflected by the reflective regions, such that resolution and image quality of the pattern transferred to the wafer 20 can be enhanced. The reflective and absorptive regions of the mask 10 are patterned such that light reflected from the reflective regions (and, in some cases, the absorptive regions) projects onto the wafer 20 and transfers the pattern of the mask image region to the wafer 20. For example, during an exposure process, light (radiation) is projected onto the mask 10, and a portion of the light is transmitted to the wafer 20, thereby transferring the pattern of the mask image region to the wafer 20. In the depicted embodiment, the wafer 20 is exposed to extreme ultraviolet (EUV) radiation (light) using the mask 10. In an example, the EUV radiation has a wavelength of about 1 nm to about 100 nm. The mask image region can be transferred to the wafer 20 multiple times using multiple exposures with the mask 10. For example, in FIG. 1B, the mask 10 is used in multiple exposure processes to pattern the wafer 20, such that the pattern of the mask image region is transferred to various fields 22 of the wafer 20. Each field 22 corresponds to at least one semiconductor device (or at least one integrated circuit device) and represents an area of the wafer 20 that will be processed at a given time. For example, an exposure tool (such as a stepper or a scanner) processes one field (such as exposing a field 22 of the wafer 20 to the mask 10), then processes the next field (such as exposing another field 22 of the wafer 20 to the mask 10), and so on. In the present example, the wafer 20 includes a resist layer disposed over a substrate, where the pattern of the mask image region is transferred to the resist layer.

During the exposure process of each field 22, exposure light leaks to adjacent fields 22, particularly at edges and corners of the fields 22. Such light leakage can be attributed to light diffraction phenomenon, positional accuracy of the mask 10 with respect to the wafer 20, positional accuracy of the mask 10 with respect to the exposure tool, other phenomena, or combinations thereof. In the present example, light leakage may result from positional accuracy of the mask 10 with respect to the exposure tool, such as the stepper or the scanner. For example, for each exposure process, the exposure tool defines a portion of the mask 10 for exposing light thereon. An exposure slit of the exposure tool (defined by blades of the exposure tool, in an example) may define the portion of the mask 10 that will be exposed to the light. Ideally, the light exposes the mask image region of the mask 10. Typically, however, the exposure slit will expose an area of the mask 10 outside the mask image region. In the depicted embodiment, a mask black border region of the mask 10 represents an area of the mask 10 that is outside the mask image region that will be exposed to the light (in other words, an area of the mask 10 outside the mask image region that is not covered by the exposure tool). Here, the mask black border region of the mask 10 is in the mask frame region, adjacent to the mask image region. Because the mask black border region of the mask 10 is exposed to light during the exposure process, the mask black border region undesirably transmits a portion of light to the wafer 20, resulting in edges of the fields 22 receiving double exposure and corners of the fields receiving quadruple exposure. To remedy such light leakage, reflectivity of the mask black border region of the mask 10 is minimized to reduce such unwanted exposure. In an example, a reflectivity at the mask black border region of the mask 10 is less than or equal to about 0.3%.

Figure 2:
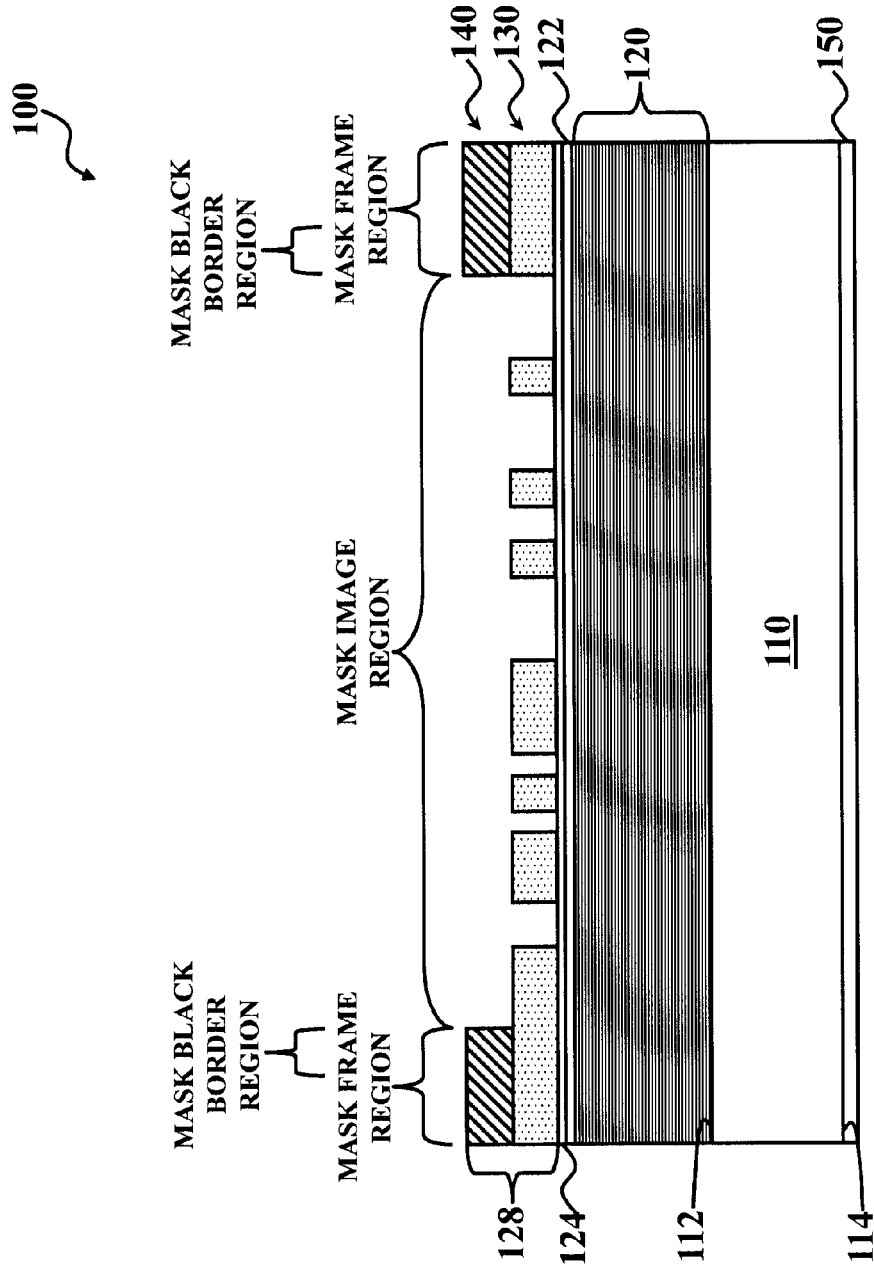
FIG. 2 is a diagrammatic cross-sectional side view of a mask according to various aspects of the present disclosure.

The present disclosure configures absorptive regions of a mask to minimize reflectivity of light at a mask black border region of the mask, which often arises during exposure processes using the mask as described herein. FIG. 2 is a diagrammatic cross-sectional side view of a mask 100, in portion or entirety, according to various aspects of the present disclosure. The mask 100 is a reflective mask that includes absorptive regions configured to minimize reflectivity of light, particularly extreme ultraviolet (EUV) radiation (for example, EUV radiation having a wavelength of about 1 nm to about 100 nm, although other wavelengths of light (radiation) are contemplated by the present disclosure), at a mask black border region of the mask 100. In the depicted embodiment, the mask 100 is a phase shift mask, such as an attenuated phase shift mask (AttPSM). Alternatively, the phase shift mask is an alternating phase shift mask (AltPSM). FIG. 2 has been simplified for the sake of clarity to better understand the inventive concepts of the present disclosure. Additional features can be added in the mask 100, and some of the features described below can be replaced or eliminated for additional embodiments of the mask 100.

The mask 100 includes a mask image region and a mask frame region. The mask image region is an area of the mask 100 that includes a pattern (or design) of a layer of an integrated circuit device (or chip). For example, the mask 100 includes a pattern (or design) of a layer of a resistor, a capacitor, an inductor, a diode, a metal-oxide-semiconductor field effect transistor (MOSFET), a complementary MOS (CMOS) transistor, a bipolar junction transistor (BJT), a laterally diffused MOS (LDMOS) transistor, a high power MOS transistor, a fin-like field effect transistor (FinFET), other integrated circuit component, or combination thereof. The mask frame region is an area of the mask 100 that does not include the pattern (or design) of the layer of the integrated circuit device. The mask frame region may include a pattern (or designs) that define alignment marks (also referred to as fiducial marks). The mask frame region borders the mask image region and, in the present example, the mask frame region surrounds (or defines the area of) the mask image region. The mask 100 further includes a mask black border region, which is an area of the mask 100 outside the mask image region that is exposed during an exposure process. In the present example, the mask black border region is a portion of the mask frame region that is adjacent to the mask image region. In another example, the mask black border region is the entire mask frame region.

During an exposure process, light (radiation) is projected onto the mask 100, and a portion of the light is transmitted to a wafer, thereby transferring the pattern of the mask image region to the wafer. The mask image region can be transferred to the wafer multiple times using multiple exposures with the mask 100. For example, the mask 100 is used in multiple exposure processes to pattern the wafer, such that the pattern of the mask image region is transferred to various fields of the wafer, as described with reference to mask 10 and FIGS. 1A and 1B above. Each field corresponds to at least one semiconductor device (or at least one integrated circuit device) and represents an area of the wafer that will be processed at a given time. For example, an exposure tool (such as a stepper or a scanner) processes one field (such as exposing a field of the wafer to the mask 100), then processes the next field (such as exposing another field of the wafer to the mask 100), and so on. In the present example, the wafer includes a resist layer disposed over a substrate, where the pattern of the mask image region is transferred to the resist layer. As described below, the mask 100 reduces reflectivity of the mask black border region, thereby reducing the amount of exposure experienced in adjacent fields (such as that illustrated in FIGS. 1A and 1B), particularly at edges of adjacent fields and corners of adjacent fields. Such reduction in light leakage enhances a resulting aerial image contrast realized by the mask 100 during integrated circuit device fabrication.

The mask 100 includes a substrate 110 that has a surface 112 and a surface 114 that is opposite the surface 112. The substrate 110 includes a low thermal expansion material (LTEM), such as quartz or glass. In an example, the LTEM substrate is a $SiO_2$—$TiO_2$-based glass substrate. A reflective multilayer coating 120 is disposed over the substrate 110, particularly over the surface 112 of the substrate 110. The reflective multilayer coating 120 (also referred to as a multilayer mirror (MLM)) includes a number of material layer/film pairs, where each pair includes at least two material layers having different refractive indices. A typical number of film pairs is about twenty to about eighty pairs, however, the reflective multilayer coating 120 may have any number of film pairs. The material of the at least two material layers is selected such that the reflective multilayer coating 120 exhibits high reflectivity to a particular radiation type/wavelength. In the depicted embodiment, the reflective multilayer coating 120 includes material layer pairs that exhibit high reflectivity to EUV radiation. For example, the reflective multilayer coating 120 includes molybdenum-silicon (Mo/Si) film pairs (in other words, each pair includes a molybdenum layer disposed above or below a silicon layer). In an example, the reflective multilayer coating 120 includes forty Mo/Si film pairs. Alternatively, the reflective multilayer coating 120 includes molybdenum-beryllium (Mo/Be) film pairs, or any other combination of material film pairs that exhibit high reflectivity at EUV wavelengths. A thickness of the reflective multilayer coating 120 may be adjusted to achieve maximum constructive interference of the EUV radiation reflected at each interface of the film pairs while achieving a minimum absorption of the EUV radiation by the reflective multilayer coating 120. A thickness of each layer of the reflective multilayer coating 120 is determined based on the type of EUV radiation and incident angle of the EUV radiation projected onto the mask 100. In the depicted embodiment, each of the molybdenum layers and the silicon layers of the Mo/Si film pairs have a thickness of about 4 nm to about 7 nm.

A capping layer 122 is disposed over the reflective multilayer coating 120. In the depicted embodiment, the capping layer 122 includes a silicon-containing material, such as silicon. In an example, the capping layer 122 is a silicon layer of a topmost Mo/Si film pair of the reflective multilayer coating 120. The capping layer 122 can prevent oxidation of the reflective multilayer coating 120, for example, during processing of the mask 100. The capping layer 122 may thus include a material, other than a silicon-containing material, that prevents oxidation of the reflective multilayer coating 120. In an example, the capping layer 122 has a thickness of about 4 nm to about 7 nm.

A buffer layer 124 is disposed over the capping layer 122. The buffer layer 124 includes a material that protects the reflective multilayer coating 120 during processing of the mask 100 (for example, during etching of an absorption layer of the mask 100). In the depicted embodiment, the buffer layer 124 includes a ruthenium-containing material, such as Ru, RuNb, RuZr, RuMo, RuY, RuB, RuTi, RuLa, other ruthenium-containing material, or combinations thereof. Alternatively, the buffer layer 124 includes a chromium-containing material, such as Cr, CrN, CrO, CrC, CrON, CrCN, CrOC, CrOCN, other chromium-containing material, or combinations thereof. In yet another alternative, the buffer layer 124 includes materials other than ruthenium-containing materials and chromium-containing materials. The buffer layer 124 may include a combination of ruthenium-containing material, chromium-containing material, and other material, for example, where the buffer layer 124 includes multiple layers. In an example, the buffer layer 124 has a thickness of about 2 nm to about 5 nm. It is noted that, in alternative embodiments, the capping layer 122 and buffer layer 124 may be a single layer.

An absorption stack 128 is disposed over the buffer layer 124. The absorption stack 128 includes one or more layers designed to absorb radiation in the radiation type/wavelength range projected onto the mask 100. In the depicted embodiment, the one or more layers of the absorption stack 128 are designed to absorb EUV radiation. The one or more layers include various materials, such as tantalum-containing materials (for example, Ta, TaN, TaNH, TaHF, TaHfN, TaBSi, TaB—SiN, TaB, TaBN, TaSi, TaSiN, TaGe, TaGeN, TaZr, TaZrN, other tantalum-containing materials, or combinations thereof), chromium-containing materials (for example, Cr, CrN, CrO, CrC, CrON, CrCN, CrOC, CrOCN, other chromium-containing material, or combinations thereof), titanium-containing materials (for example, Ti, TiN, other titanium-containing material, or combinations thereof), other suitable materials, or combinations thereof. A configuration of the one or more layers (such as material composition of the one or more layers) is selected to provide process flexibility during fabrication of the mask 100. For example, etching characteristics of the one or more layers of the absorption stack 128 provide process flexibility, which can reduce manufacturing time and costs.

In the depicted embodiment, the absorption stack 128 includes an absorber layer 130 disposed over the buffer layer 124, and an absorber layer 140 disposed over the absorber layer 130. A refractive index of the absorber layer 140 is higher than the refractive index of the absorber layer 130, and an extinction coefficient of the absorber layer 140 is higher than the extinction coefficient of the absorber layer 130. The absorber layer 130 and absorber layer 140 include materials to achieve the refractive index and extinction coefficient differences. The absorber layer 130 includes a silver-containing material, and the absorber layer 140 includes a tantalum-containing material (for example, Ta, TaN, TaNH, TaHF, TaHfN, TaBSi, TaB—SiN, TaB, TaBN, TaSi, TaSiN, TaGe, TaGeN, TaZr, TaZrN, other tantalum-containing materials, or combinations thereof). In the depicted embodiment, the absorber layer 130 is an $Ag_2O$ layer, and the absorber layer 140 is a TaBN layer. In an example, the absorber layer 130 and the absorber layer 140 each have a thickness of about 30 nm to about 40 nm.

The absorber layer 130 and the absorber layer 140 are patterned, such that the absorber layer 130 is disposed in the mask image region and the mask frame region of the mask 100, and the absorber layer 140 is disposed in the mask frame region of the mask 100. The absorber layer 130 defines the pattern (or design) of the layer of the integrated circuit device (or chip) in the mask image region of the mask 100, and the absorber layer 130/absorber layer 140 may define the pattern of alignment marks in the mask frame region of the mask 100. In the depicted embodiment, the absorber layer 140 is disposed adjacent to the mask image region of the mask 100, particularly within an area of the mask frame region of the mask 100 that corresponds with the mask black border region of the mask 100. The absorber layer 140 reduces reflectivity of the mask black border region of the mask 100, thereby reducing the amount of exposure experienced in adjacent fields (such as that illustrated in FIGS. 1A and 1B), particularly at edges of adjacent fields and corners of adjacent fields. Such reduction in light leakage enhances a resulting aerial image contrast realized by the mask 100 during integrated circuit device fabrication. Further, the materials selected for the absorber layer 130 (in the present example, the $Ag_2O$ layer) and the absorber layer 140 (in the present example, the TaBN layer) provide an optimized combination of refractive indexes, extinction coefficients, and thicknesses according to current mask fabrication ability that minimizes reflectivity of the mask black border region of the mask 100, which can reduce shadowing effects and mask black border effects while enhancing printability of the mask 100.

A conductive layer 150 is disposed over the substrate 110, particularly over the surface 114 of the substrate 110. The conductive layer includes a material that facilitates electrostatic chucking. For example, the conductive layer 150 includes a chromium-containing material, such as Cr, CrN, CrO, CrC, CrON, CrCN, CrOC, CrOCN, other chromium-containing materials, or combinations thereof. In the depicted embodiment, the conductive layer 150 is a CrN layer. In an example, the conductive layer 150 has a thickness of about 10 nm to about 30 nm.

Figure 3:
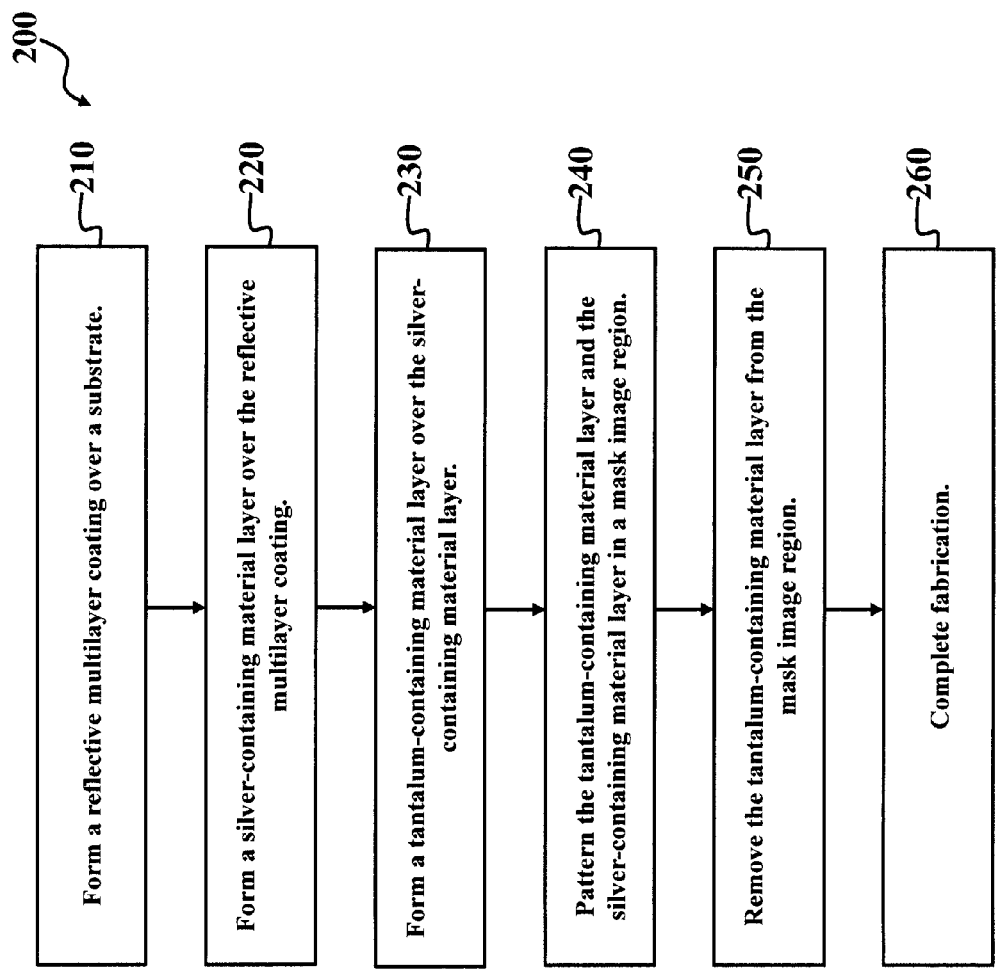
FIG. 3 is a flow chart of a method for fabricating a mask according to various aspects of the present disclosure.

FIG. 3 is a flow chart of a method 200 for fabricating a mask according to various aspects of the present disclosure. The mask fabricated by the method 200 has a mask black border region with minimized reflectivity. The method 200 begins at block 210 where a reflective multilayer coating is formed over a substrate. At block 220, a silver-containing material layer is formed over the reflective multilayer coating. In the present example, the silver-containing material layer is an $Ag_2O$ layer. At block 230, a tantalum-containing material layer is formed over the silver-containing material layer. In the present example, the tantalum-containing material layer is a TaBN layer. At block 240, the tantalum-containing material layer and the silver-containing material layer are patterned in a mask image region of the mask. In the present example, the tantalum-containing material layer and the silver-containing material layer are patterned using a same etching gas. The patterned silver-containing material layer defines a pattern (or design) of a layer of an integrated circuit device (or chip) in the mask image region, and the patterned silver-containing material layer/tantalum-containing material layer may define a pattern of alignment marks in a mask frame region of the mask. At block 250, the tantalum-containing material layer is removed from the mask image region. The tantalum-containing material layer thus remains adjacent the mask image region in the mask black border region of the mask. In the present example, the tantalum-containing material is removed using an etching gas that selectively removes the tantalum-containing material, without removing the silver-containing material. At block 260, the method 200 may continue to complete fabrication of the mask. Additional steps can be provided before, during, and after the method 200, and some of the steps described can be replaced or eliminated for additional embodiments of the method 200. The discussion that follows illustrates a mask that can be fabricated according to the method 200 of FIG. 3.

FIGS. 4-9 are various diagrammatic cross-sectional views of an embodiment of a mask 300 during various fabrication stages according to the method 200 of FIG. 3. FIGS. 4-9 have been simplified for the sake of clarity to better understand the inventive concepts of the present disclosure. The mask 300 of FIGS. 4-9 is similar in many respects to the mask 100 of FIG. 2. For example, the mask 300 is a reflective mask that includes absorptive regions configured to minimize reflectivity of light, particularly EUV radiation (for example, EUV radiation having a wavelength of about 1 nm to about 100 nm, although other wavelengths of light (radiation) are contemplated by the present disclosure), at a mask black border region of the mask 300. In the depicted embodiment, the mask 300 is a phase shift mask, such as an attenuated phase shift mask (AttPSM). Alternatively, the phase shift mask is an alternating phase shift mask (AltPSM). Accordingly, for simplicity and clarity, similar features of mask 300 and mask 100 will be noted without exhaustive explanation of such features with respect to the mask 300. Additional features can be added in the mask 300, and some of the features described below can be replaced or eliminated for additional embodiments of the mask 300.

Figure 4:
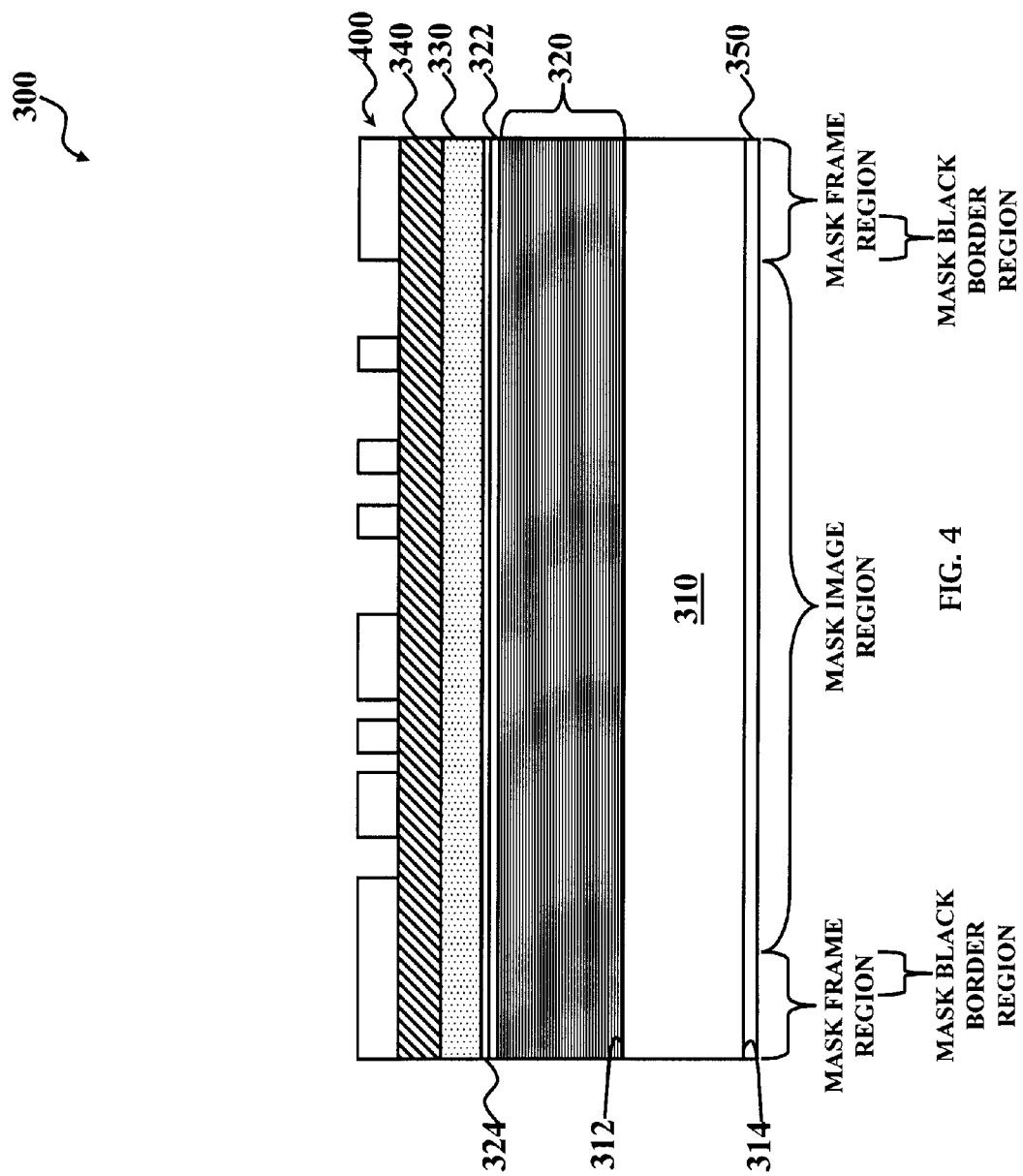
FIGS. 4-9 are diagrammatic cross-sectional side views of a mask during various stages of the method of FIG. 4 according to various aspects of the present disclosure.

In FIG. 4, similar to the mask 100, the mask 300 includes a mask image region, a mask frame region, and a mask black border region. The mask image region is an area of the mask 300 that will include a pattern (or design) of a layer of an integrated circuit device; the mask frame region is an area of the mask 300 that will not include the pattern (or design) of the layer of the integrated circuit device; and the mask black border region is an area of the mask 300 outside the mask image region that is exposed during an exposure process. The mask frame region may include a pattern that defines alignment marks. In the present example, the mask frame region surrounds the mask image region, and the mask black border region is a portion of the mask frame region that is adjacent to the mask image region. In another example, the mask black border region is the entire mask frame region.

A substrate 310 of the mask 300 is provided. The substrate 310 has a surface 312 and a surface 314 that is opposite the surface 314. The substrate 310 is similar to the substrate 110 having the surface 112 and surface 114 described above. A reflective multilayer coating 320, which is similar to the reflective multilayer coating 120 described above, is formed over the substrate 310, particularly the surface 312 of the substrate 310. Further, a capping layer 322, similar to the capping layer 122 described above, is disposed over the reflective multilayer coating 320; a buffer layer 324, similar to the buffer layer 124 described above, is disposed over the capping layer 322; an absorber layer 330, similar to the absorber layer 130 described above, is disposed over the buffer layer 324; an absorber layer 340, similar to the absorber layer 140, is disposed over the absorber layer 330; and a conductive layer 350, similar to the conductive layer 150, is disposed over the surface 314 of the substrate 310. In FIG. 4, the absorber layer 330 and the absorber layer 340 have not yet been patterned, and the absorber layer 330 and the absorber layer 340 are thus disposed uniformly in the mask frame region and the mask image region. The reflective multilayer coating 320, capping layer 322, buffer layer 324, absorber layer 330, absorber layer 340, and conductive layer 350 are formed by various methods, including physical vapor deposition (PVD) processes (for example, evaporation and DC magnetron sputtering), plating processes (for example, electrodeless plating or electroplating), chemical vapor deposition (CVD) processes (for example, atmospheric pressure CVD (APCVD), low pressure CVD (LPCVD), plasma enhanced CVD (PECVD), or high density plasma CVD (HDPCVD)), ion beam deposition, spin-on coating, metal-organic decomposition (MOD), other suitable methods, or combinations thereof. It is noted that the conductive layer 350 may be formed before or after patterning of the absorber layer 330 and the absorber layer 340.

Figure 5:
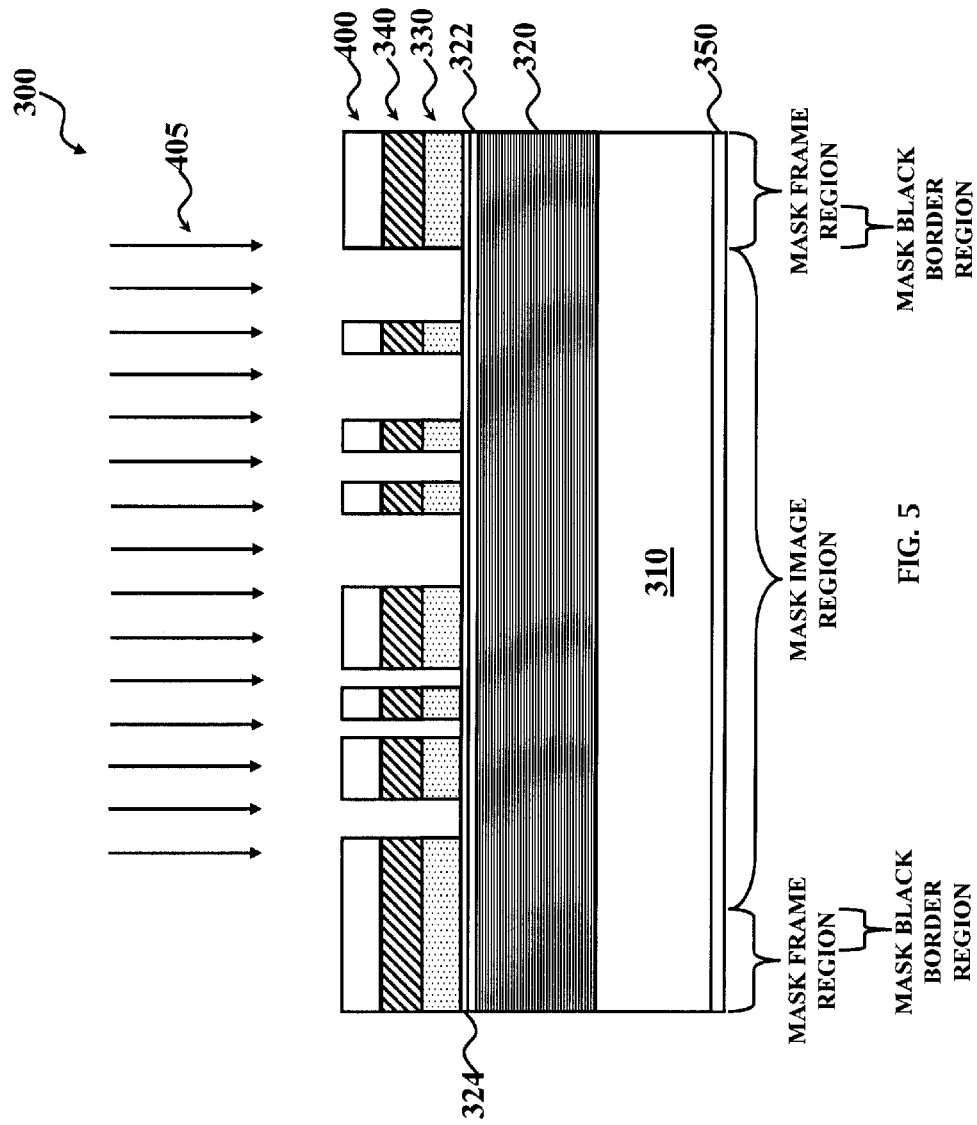

In FIG. 4 and FIG. 5, the mask image region of the mask 300 is patterned to form a pattern (or design) of a layer of an integrated circuit device, and the mask frame region of the mask 300 may be patterned to form alignment marks. In FIG. 4, a patterned resist layer 400 is formed over the absorber layer 340. Openings within the patterned resist layer 400 expose portions of the absorber layer 340 in the mask image region of the mask 300. The patterned resist layer 400 is a radiation-sensitive resist layer (also referred to as a photoresist layer, photosensitive layer, patterning layer, imaging layer, and light sensitive layer) that is responsive to an exposure process. The patterned resist layer 400 includes a positive-type resist material or a negative-type resist material, and may have a multi-layer structure. The patterned resist layer 400 is formed by any suitable method. In an example, a resist layer is deposited over the absorber layer 340, for example, by a spin-on coating process; exposed to an electron beam (electron beam (e-beam) lithography); and developed such that either exposed or unexposed portions of the resist layer remain to form the patterned resist layer 400. Such process may include a baking process (such as a post-exposure baking process and/or a pre-exposure baking process), a rinsing process, other suitable process, or combinations thereof. Alternatively, the patterned resist layer 400 is formed by exposing the resist layer to radiation using a mask. In yet another alternative, the patterned resist layer 400 is formed by exposing the resist layer to an ion-beam or other suitable method.

Figure 6:
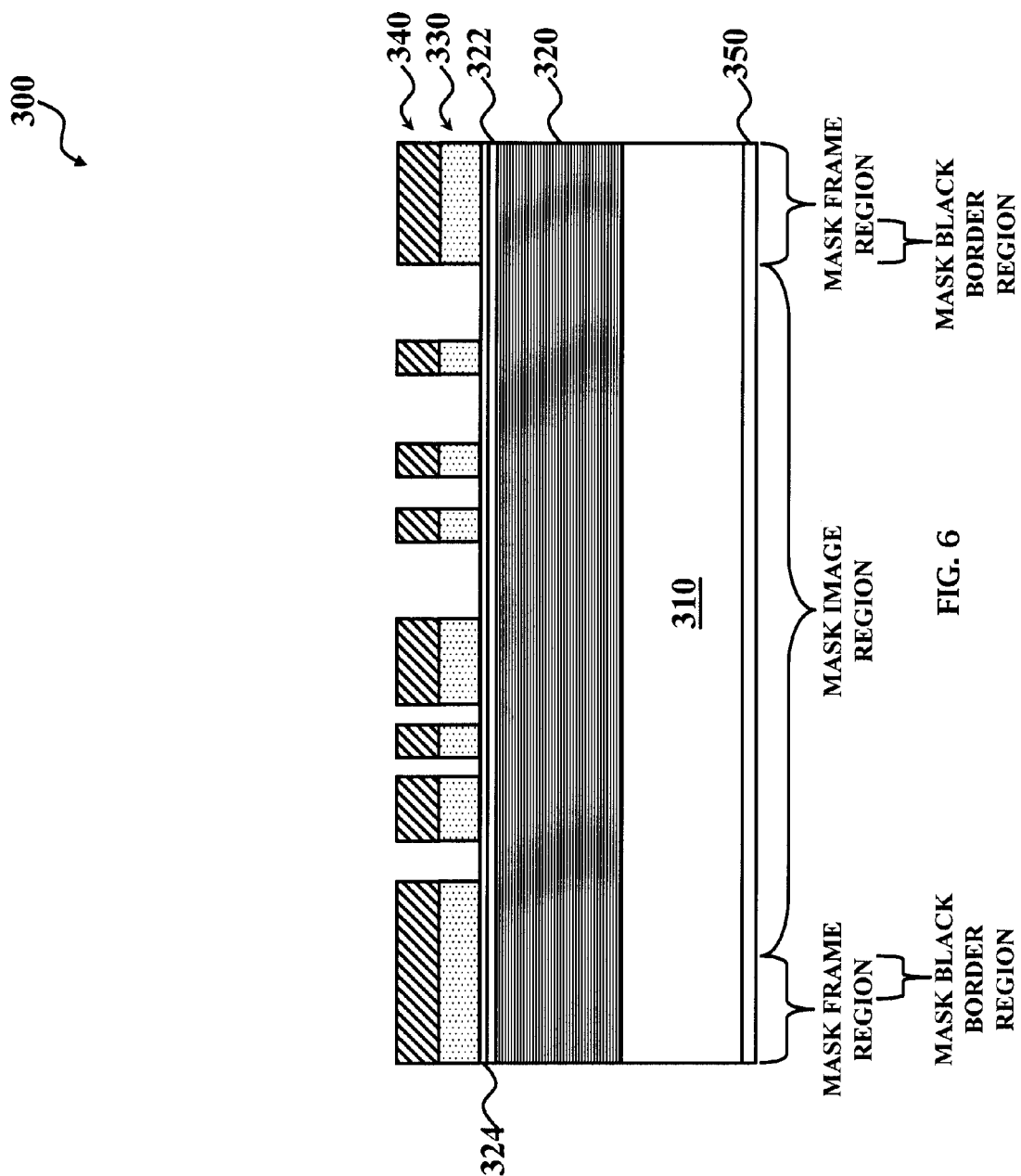

In FIG. 5, an etching process 405 uses the patterned resist layer 400 as a mask, such that the exposed portions of the absorber layer 340 are removed in the mask image region of the mask 300. The etching process 405 also removes portions of the absorber layer 330 underlying the exposed portions of the absorber layer 340 in the mask image region. Unexposed portions of the absorber layer 330 and the absorber layer 340 remain in the mask frame region and the mask image region of the mask 300. The etching process 405 includes a dry etching process, a wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters. In the depicted embodiment, the etching process 405 uses a dry etching process that selectively etches both the absorber layer 340 and the absorber layer 330. For example, the etching process 405 uses a chlorine-containing gas (such as $Cl_2$, $SiCl_4$, HCl, $CCl_4$, $CHCl_3$, other chlorine-containing gas, or combinations thereof) and an oxygen-containing gas (such as $O_2$, other oxygen-containing gas, or combinations thereof). In the depicted embodiment, where the absorber layer 330 is an $Ag_2O$ layer and the absorber layer 340 is a TaBN layer, the etching process 405 uses a mixture of $Cl_2$ gas and $O_2$ gas to remove the exposed absorber layer 340 and underlying absorber layer 330. In the present example, the buffer layer 324 includes a material having a different etching characteristic than the absorber layer 330 and the absorber layer 340, such that the buffer layer 324 acts as an etch stop layer during the etching process 405. The etching process 405 thus selectively removes the material layers (here, the absorber layer 330 and the absorber layer 340) above the buffer layer 324. Thereafter, the patterned resist layer 400 is removed from the mask 300, as illustrated in FIG. 6 (for example, by a resist stripping process), leaving patterned absorber layer 340 and patterned absorber layer 330. The patterned absorber layer 330 defines the pattern (or design) of the layer of the integrated circuit device (or chip) in the mask image region of the mask 300, and the patterned absorber layer 330 may define the pattern of alignments mark in the mask frame region.

Figure 7:
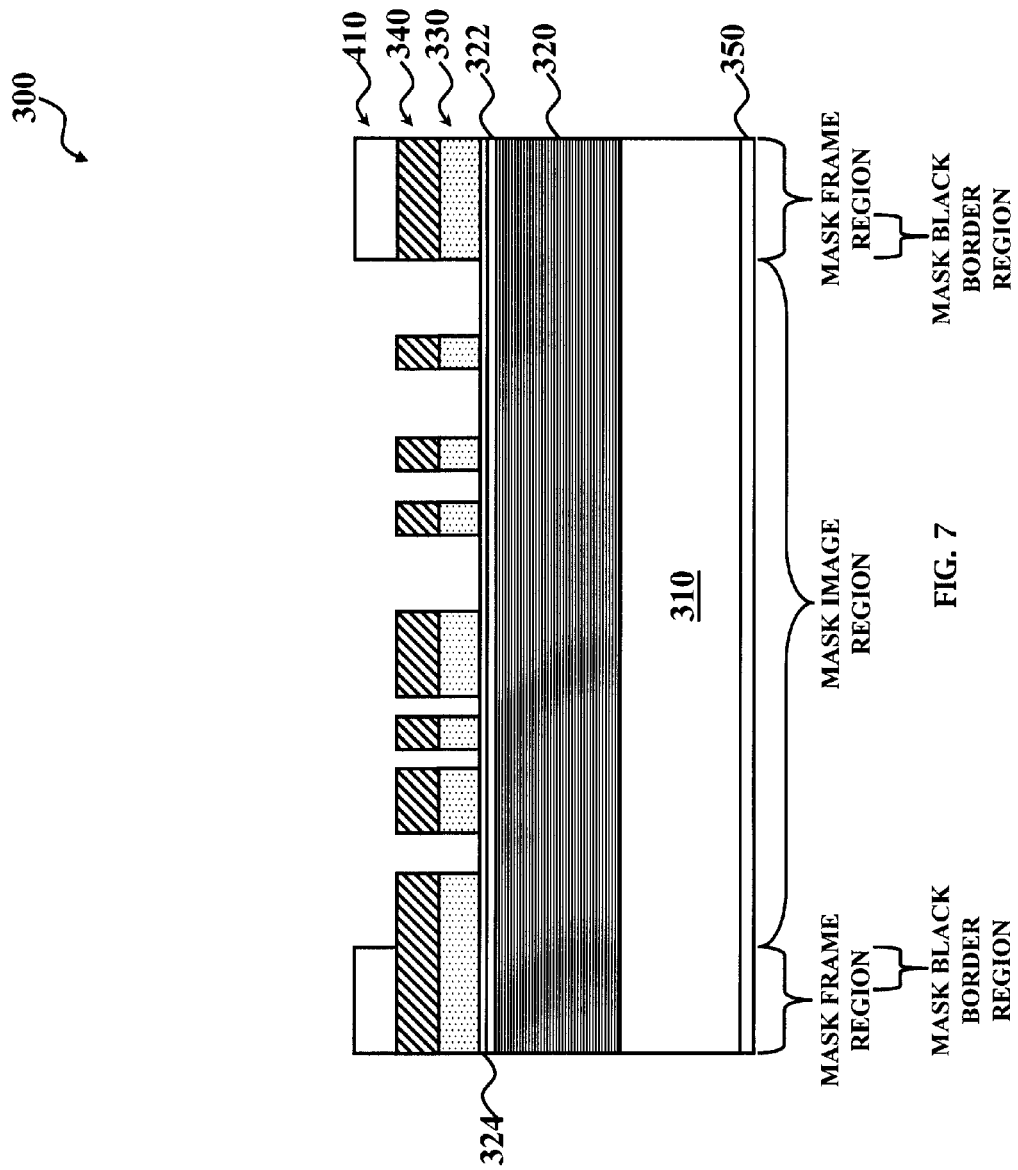
Figure 8:
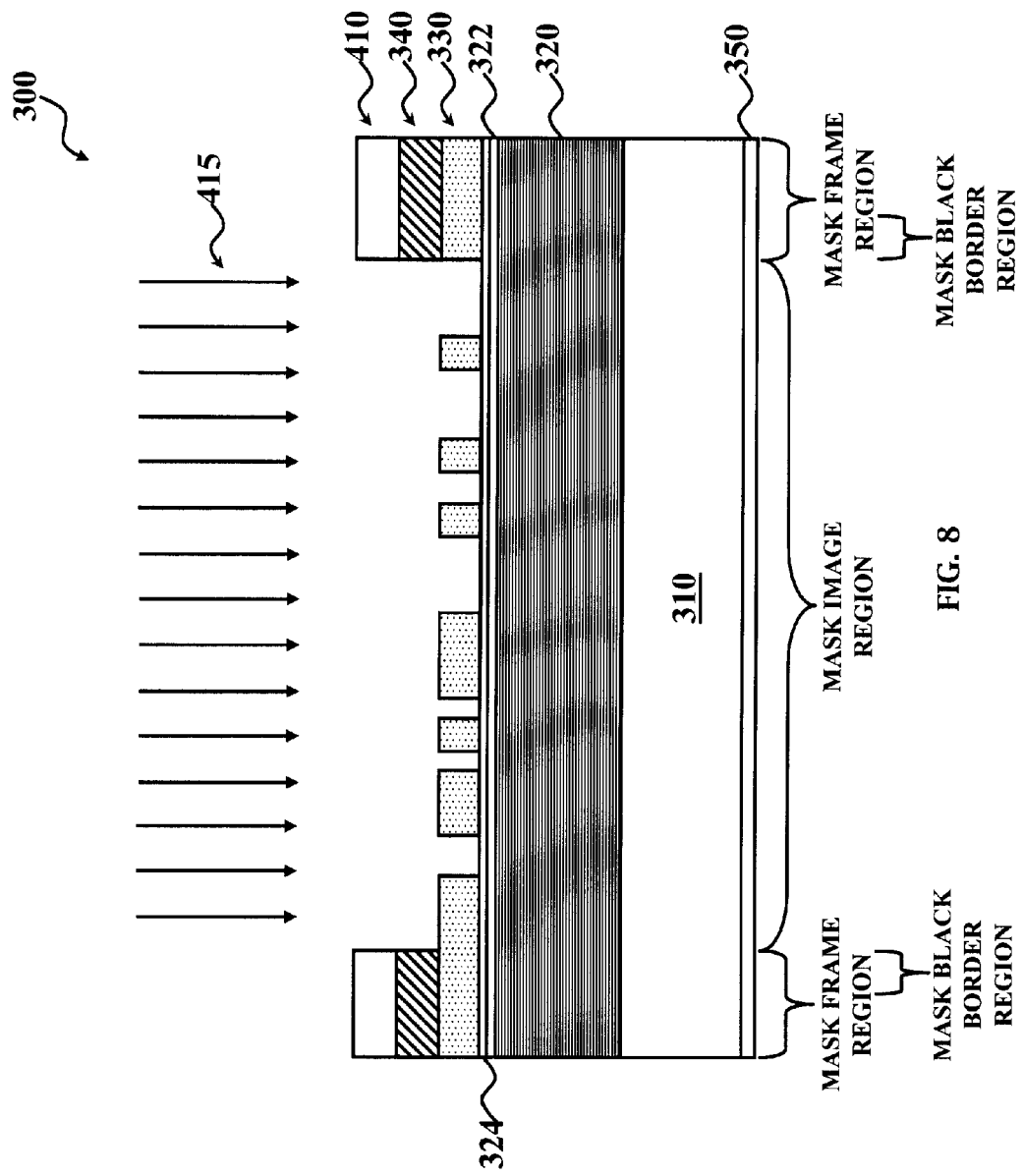

In FIG. 7 and FIG. 8, the absorber layer 340 is removed from the mask image region of the mask 300. In FIG. 7, a patterned resist layer 410 is formed over the absorber layer 340. Openings within the patterned resist layer 410 expose the absorber layer 330 in the mask image region of the mask 300. The patterned resist layer 410 is a radiation-sensitive resist layer that is responsive to an exposure process. The patterned resist layer 410 includes a positive-type resist material or a negative-type resist material, and may have a multi-layer structure. The patterned resist layer 410 is formed by any suitable method. In an example, a resist layer is deposited over the absorber layer 340, for example, by a spin-on coating process; exposed to an electron beam (electron beam (e-beam) lithography); and developed such that either exposed or unexposed portions of the resist layer remain to form the patterned resist layer 410. Such process may include a baking process (such as a post-exposure baking process and/or a pre-exposure baking process), a rinsing process, other suitable process, or combinations thereof. Alternatively, the patterned resist layer 410 is formed by exposing the resist layer to radiation using a mask. In yet another alternative, the patterned resist layer 410 is formed by exposing the resist layer to an ion-beam or other suitable method.

In FIG. 8, an etching process 415 uses the patterned resist layer 410 as a mask, such that the exposed portions of the absorber layer 340 are removed in the mask image region of the mask 300. The etching process 415 does not remove portions of the absorber layer 330 that underlay the exposed portions of the absorber layer 340 in the mask image region. Unexposed portions of the absorber layer 340 remain in the mask frame region of the mask 300. The etching process 415 includes a dry etching process, a wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters. In the depicted embodiment, the etching process 415 uses a dry etching process that selectively etches the absorber layer 340. For example, the etching process 415 uses a chlorine-containing gas (such as $Cl_2$, $SiCl_4$, HCl, $CCl_4$, $CHCl_3$, other chlorine-containing gas, or combinations thereof) that selectively removes the exposed absorber layer 340. In the depicted embodiment, where the absorber layer 330 is an $Ag_2O$ layer and the absorber layer 340 is a TaBN layer, the etching process 415 uses a $Cl_2$ gas to remove the exposed absorber layer 340. The $Cl_2$ gas alone cannot etch the absorber layer 340, and similar to the etching process 405, the buffer layer 324 acts as an etch stop layer during the etching process 415. The etching process 415 thus selectively removes the absorber layer 340 without removing the absorber layer 330 or the buffer layer 324.

Figure 9:
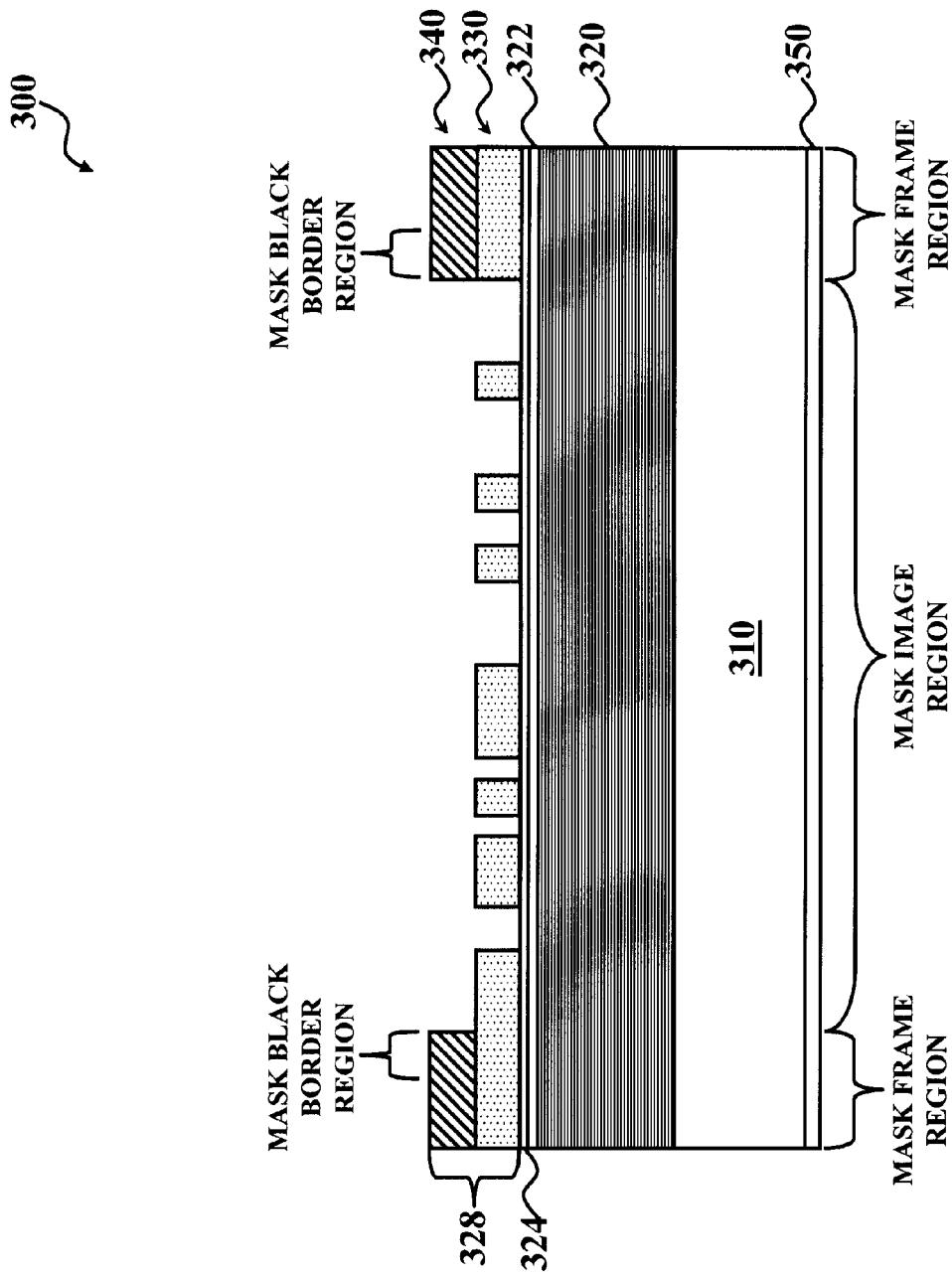

Thereafter, the patterned resist layer 410 is removed from the mask 300, as illustrated in FIG. 9 (for example, by a resist stripping process), leaving absorptive stack 328 that includes the patterned absorber layer 340 and patterned absorber layer 330. In the depicted embodiment, the absorber layer 340 is located in the mask frame region, particularly adjacent the mask image region in the mask black boarder region of the mask 300. The configuration of the absorptive stack 328 (including the material and location of the absorber layer 330 and the absorber layer 340) exhibits reduced reflectivity at the mask black border region of the mask 300, thereby reducing excessive exposure dose issues. Aerial image contrast can thus be achieved by the mask 300 when used for exposure processes in integrated circuit fabrication. It is further noted that, in FIGS. 4-9, the buffer layer 324, the absorber layer 330, and the absorber layer 340 include materials having various etching characteristics, and the etching processes 405 and 415 use various etching chemistries, to ensure that the etching process 405 selectively removes the absorber layer 330 and the absorber layer 340 without removing the buffer layer 324 and the etching process 415 selectively removes the absorber layer 340 without removing the buffer layer 324 and the absorber layer 330. Such etching characteristics can reduce mask fabrication time and costs. Different embodiments may have different advantages, and no particular advantage is necessarily required of any embodiment.

The present disclosure provides for many different embodiments. An exemplary mask includes a substrate; a reflective multilayer coating disposed over the substrate; an $Ag_2O$ absorber layer disposed over the reflective multilayer coating; and a tantalum-containing absorber layer disposed over the $Ag_2O$ absorber layer adjacent a mask image region. In an example, the tantalum-containing absorber layer is a TaBN layer. The substrate may include a low thermal expansion material (LTEM), and the reflective multilayer coating may include a plurality of molybdenum-silicon (Mo—Si) film pairs. In an example, the mask further includes a ruthenium-containing buffer layer disposed between the reflective multilayer coating and the $Ag_2O$ absorber layer; a silicon-containing capping layer disposed between the reflective multilayer coating and the ruthenium-containing buffer layer; and a conductive layer disposed over a surface of the substrate that is opposite a surface of the substrate over which the reflective multilayer coating is disposed.

An exemplary phase shift mask includes a low thermal expansion material (LTEM) substrate; a reflective multilayer coating disposed over the LTEM substrate; and an absorptive stack disposed over the reflective multilayer coating. The absorptive stack includes an Ag$_2$O absorber layer disposed over the reflective multilayer coating in a mask image region and mask frame region, and a tantalum-containing absorber layer disposed over the Ag$_2$O absorber layer in the mask frame region. In an example, the tantalum-containing absorber layer is a TaBN layer. The tantalum-containing absorber layer is disposed in a mask black border region of the mask frame region, where the mask black border region is adjacent the mask image region.

An exemplary method includes forming a reflective multilayer coating over a substrate; forming a silver-containing absorber layer over the reflective multilayer coating; forming a tantalum-containing absorber layer over the silver-containing absorber layer; and patterning the silver-containing absorber layer and the tantalum-containing absorber layer in a mask image region and a mask frame region, such that the silver-containing absorber layer defines a pattern in the mask image region and the tantalum-containing absorber layer remains adjacent the mask image region in the mask frame region. The patterning includes a first etch step that includes removing portions of the silver-containing absorber layer and the tantalum-containing absorber layer from the mask image region, and a second etch step that includes removing remaining portions of the tantalum-containing absorber layer from the mask image region. In an example, the silver-containing absorber layer is an Ag$_2$O layer and the tantalum-containing absorber layer is a TaBN layer. The first etch step uses a same gas to remove the portions of the silver-containing absorber layer and the tantalum-containing absorber layer from the mask image region. For example, the first etch step includes using a mixture of a chlorine-containing gas, such as Cl$_2$, and an oxygen-containing gas, such as O$_2$, and the second etch step includes using the chlorine-containing gas. The second etch step may use the silver-containing absorber layer as an etch stop. The method may further include forming a buffer layer between the reflective multilayer coating and the silver-containing absorber layer, where the buffer layer acts as an etch stop during the first etch step and the second etch step.

An exemplary method for fabricating a mask includes forming a reflective multilayer coating over a substrate; forming an Ag$_2$O absorber layer over the reflective multilayer coating; forming a tantalum-containing absorber layer over the Ag$_2$O absorber layer; patterning the Ag$_2$O absorber layer and the tantalum-containing absorber layer in a mask image region; and removing the tantalum-containing absorber layer from the mask image region. The Ag$_2$O absorber layer and the tantalum-containing absorber layer may be patterned by etching portions of the Ag$_2$O absorber layer and the tantalum-containing absorber layer using a mixture of Cl$_2$ gas and O$_2$ gas; and removing the tantalum-containing absorber layer may include etching remaining portions of the tantalum-containing absorber layer using a Cl$_2$ gas.

An exemplary lithography process includes providing an EUV mask having a mask image region and a mask frame region, wherein the mask image region of the EUV mask includes a pattern of an integrated circuit device; and exposing a wafer to EUV radiation using the EUV mask, wherein the pattern of the mask image region of the EUV mask is transferred to the wafer during the exposing. The EUV mask includes a substrate a reflective multilayer coating disposed over the substrate and an absorptive stack disposed over the reflective multilayer coating. The absorptive stack includes an Ag$_2$O absorber layer disposed over the reflective multilayer coating in the mask image region and the mask frame region, and a tantalum-containing absorber layer disposed over the Ag$_2$O absorber layer in the mask frame region. In an example, exposing includes transferring the pattern of the mask image region of the EUV mask to adjacent fields of the wafer. In an example, the tantalum-containing absorber layer is a TaBN layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask comprising:
    a substrate;
    a reflective multilayer coating disposed over the substrate;
    an Ag$_2$O absorber layer disposed over the reflective multilayer coating; and
    a tantalum-containing absorber layer disposed over the Ag$_2$O absorber layer adjacent to a mask image region.

2. The mask of claim 1 wherein the tantalum-containing absorber layer is a TaBN layer.

3. The mask of claim 1 wherein the substrate includes a low thermal expansion material (LTEM).

4. The mask of claim 1 further including a ruthenium-containing buffer layer disposed between the reflective multilayer coating and the Ag$_2$O absorber layer.

5. The mask of claim 4 further including a silicon-containing capping layer disposed between the reflective multilayer coating and the ruthenium-containing buffer layer.

6. The mask of claim 5, further including a conductive layer disposed over the substrate, wherein the reflective multilayer coating is disposed over a first surface of the substrate and the conductive layer is disposed over a second surface of the substrate, the second surface being opposite the first surface.

7. A phase shift mask comprising:
    a low thermal expansion material (LTEM) substrate;
    a reflective multilayer coating disposed over the LTEM substrate; and
    an absorptive stack disposed over the reflective multilayer coating, wherein the absorptive stack includes:
        an Ag$_2$O absorber layer disposed over the reflective multilayer coating in a mask image region and a mask frame region, and
        a tantalum-containing absorber layer disposed over the Ag$_2$O absorber layer in the mask frame region.

8. The phase shift mask of claim 7 wherein the tantalum-containing absorber layer is a TaBN layer.

9. The mask of claim 7 wherein the tantalum-containing absorber layer is disposed in a mask black border region of the mask frame region, wherein the mask black border region is adjacent to the mask image region.

10. The mask of claim 1, wherein the Ag$_2$O absorber layer is disposed in the mask image region and adjacent to the mask image region.

11. A method comprising:
    forming a reflective multilayer coating over a substrate;
    forming a silver-containing absorber layer over the reflective multilayer coating;
    forming a tantalum-containing absorber layer over the silver-containing absorber layer;

patterning the silver-containing absorber layer and the tantalum-containing absorber layer in a mask image region and a mask frame region, such that the silver-containing absorber layer defines a pattern in the mask image region and the tantalum-containing absorber layer remains adjacent to the mask image region in the mask frame region, wherein the patterning includes:
- a first etch step that includes removing portions of the silver-containing absorber layer and the tantalum-containing absorber layer from the mask image region, and
- a second etch step that includes removing remaining portions of the tantalum-containing absorber layer from the mask image region.

12. The method of claim 11 wherein:
forming the silver-containing absorber layer includes forming an $Ag_2O$ layer; and
forming the tantalum-containing absorber layer includes forming a TaBN layer.

13. The method of claim 11 wherein:
the first etch step includes using a mixture of a chlorine-containing gas and an oxygen-containing gas; and
the second etch step includes using the chlorine-containing gas.

14. The method of claim 13 wherein the chlorine-containing gas is $Cl_2$ and the oxygen-containing gas is $O_2$.

15. The method of claim 11 wherein the first etch step uses a same gas to remove the portions of the silver-containing absorber layer and the tantalum-containing absorber layer from the mask image region.

16. The method of claim 15 wherein the second etch step uses the silver-containing absorber layer as an etch stop.

17. The method of claim 11 further including forming a buffer layer between the reflective multilayer coating and the silver-containing absorber layer, wherein the buffer layer acts as an etch stop during the first etch step and the second etch step.

18. A method comprising:
providing an extreme ultraviolet (EUV) mask having a mask image region and a mask frame region, wherein the mask image region of the EUV mask includes a pattern of an integrated circuit device, and further wherein the EUV mask includes:
a substrate,
a reflective multilayer coating disposed over the substrate, and
an absorptive stack disposed over the reflective multilayer coating, wherein the absorptive stack includes:
an $Ag_2O$ absorber layer disposed over the reflective multilayer coating in the mask image region and the mask frame region, and
a tantalum-containing absorber layer disposed over the $Ag_2O$ absorber layer in the mask frame region; and
exposing a wafer to EUV radiation using the EUV mask, wherein the pattern of the mask image region of the EUV mask is transferred to the wafer during the exposing.

19. The method of claim 18 wherein the exposing includes transferring the pattern of the mask image region of the EUV mask to adjacent fields of the wafer.

20. The method of claim 18 wherein the tantalum-containing absorber layer is a TaBN layer.

* * * * *